US008748792B2

(12) United States Patent
Miyazawa et al.

(10) Patent No.: US 8,748,792 B2
(45) Date of Patent: Jun. 10, 2014

(54) PHOTOSENSOR AND PHOTOSENSOR ARRAY WITH CAPACITIVE ELEMENT (75) Inventors: Toshio Miyazawa, Chiba (JP); Atsushi Hasegawa, Togane (JP); Terunori Saitou, Mobara (JP); Kozo Yasuda, Mobara (JP); Takeshi Yonekura, Chiba (JP)

(73) Assignees: Japan Display Inc., Tokyo (JP); Panasonic Liquid Crystal Display Co., Ltd., Hyogo (JP)

( * ) Notice: Subject to any disclaimer, the term of this patent is extended or adjusted under 35 U.S.C. 154(b) by 193 days.

(21) Appl. No.: 13/241,934

(22) Filed: Sep. 23, 2011

(65) Prior Publication Data
US 2012/0074298 A1 Mar. 29, 2012

(30) Foreign Application Priority Data
Sep. 28, 2010 (JP) .................................. 2010-216707

(51) Int. Cl.
H01L 27/00 (2006.01)
(52) U.S. Cl.
USPC ...................................................... 250/208.1
(58) Field of Classification Search
USPC ................... 250/208.1; 257/432; 345/92, 104
See application file for complete search history.

(56) References Cited

U.S. PATENT DOCUMENTS 5,084,747 A * 1/1992 Miyawaki ...................... 257/432
2011/0006192 A1 1/2011 Miyazawa et al.

FOREIGN PATENT DOCUMENTS

JP 05-136390 6/1993
JP 2011-19102 1/2011

* cited by examiner

Primary Examiner — Thanh Luu
Assistant Examiner — Renee Naphas
(74) Attorney, Agent, or Firm — Antonelli, Terry, Stout & Kraus, LLP.

(57) ABSTRACT

A photosensor includes a lower electrode formed of a metal film, an amorphous silicon film disposed on the lower electrode, an n-type amorphous silicon film disposed on the amorphous silicon film, an upper electrode that is disposed on the n-type amorphous silicon film, and receives a first reference voltage, a capacitive element connected between the lower electrode and a second reference voltage, a switch circuit that inputs a first supply voltage to the lower electrode in an on-state, and puts the lower electrode into a floating state in an off-state, and a detector circuit that detects a voltage change in the lower electrode after irradiating the amorphous silicon film for a given period with light when the switch circuit is on.

17 Claims, 7 Drawing Sheets

PHOTOSENSOR AND PHOTOSENSOR ARRAY WITH CAPACITIVE ELEMENT

CROSS-REFERENCE TO RELATED APPLICATION

The present application claims priority from Japanese application JP2010-216707 filed on Sep. 28, 2010, the content of which is hereby incorporated by reference into this application.

BACKGROUND OF THE INVENTION

1. Field of the Invention

The present invention relates to a photosensor and a photosensor array, and more particularly to a photosensor array using a thick amorphous silicon film which is a light-dependent variable resistance element as a photosensor element.

2. Description of the Related Art

Ones of the present inventors have filed Japanese Patent Application (Japanese Patent Application No. 2009-162612) with respect to a photosensor and a photosensor array in which amorphous silicon (a-Si) films are used for photosensor elements. The amorphous silicon (a-Si) film of the photosensor in the invention disclosed in the filed Japanese Patent Application operates as the light-dependent variable resistance element in which a resistance is varied in response to an incident light.

SUMMARY OF THE INVENTION

The present inventors have developed photosensors each using an amorphous silicon (a-Si) film as a photosensor element, and found the following facts. That is, an n-type amorphous silicon film (n+a-Si) doped with phosphorus is inserted between a thick amorphous silicon (a-Si) film and an upper electrode so that a diode is formed by the thick amorphous silicon (a-Si) film and the n-type amorphous silicon film (n+a-Si) doped with phosphorus. Also, with the use of the diode in a forward bias, a high-sensitive photosensor that obtains a large photocurrent amplification effect can be realized.

The present invention has been made on the basis of the above-mentioned knowledge, and therefore aims at providing a photosensor using the thick amorphous silicon film as a variable resistance element depending on light, and a photosensor array in which a photocurrent by photoconduction can be amplified and output by a diode formed by a junction plane between the thick amorphous silicon film and a low-resistant n-type amorphous silicon film which is inserted between an upper electrode and the thick amorphous silicon film.

The above and other objects and new features of the present invention will become apparent from the description of the present application and the accompanying drawings.

A typical outline of the invention disclosed in the present application will be briefly described as follows.

(1) A photosensor includes: a lower electrode formed of a metal film; an amorphous silicon film disposed on the lower electrode; an n-type amorphous silicon film disposed on the amorphous silicon film; an upper electrode that is disposed on the n-type amorphous silicon film, and receives a first reference voltage; a switch circuit that inputs a first supply voltage to the lower electrode in an on-state, and puts the lower electrode into a floating state in an off-state; and a detector circuit that detects a voltage change in the lower electrode after irradiating the amorphous silicon film for a given period with light when the switch circuit is on.

(2) In the feature (1), there is further provided a capacitive element connected between the lower electrode and a second reference voltage.

(3) In the feature (2), the first reference voltage and the second reference voltage have the same voltage.

(4) In any one of the features (1) to (3), the first supply voltage is higher than the first reference voltage.

(5) In any one of the features (1) to (4), a thickness of the amorphous silicon film is 500 nm or higher.

(6) In the feature (5), a thickness of the amorphous silicon film is 1200 nm or lower.

(7) A photosensor array includes: (m×n) photosensor pixels arranged in an array; and n read lines. Each of the photosensor pixels includes a lower electrode formed of a metal film; an amorphous silicon film disposed on the lower electrode; an n-type amorphous silicon film disposed on the amorphous silicon film; an upper electrode that is disposed on the n-type amorphous silicon film, and receives a first reference voltage; and a first transistor having a second electrode connected to a corresponding read line of the n read lines, a first electrode connected to the lower electrode, and a control electrode receiving a first clock. Each of the photosensor pixels whose first transistor is on outputs a voltage change to one of the read lines within one horizontal scanning period as a sensor output voltage of the photosensor pixels.

(8) In the feature (7), each of the photosensor pixels includes a capacitive element connected between the lower electrode and a second reference voltage.

(9) In the feature (7) or (8), there are further provided n second transistors each having a first electrode connected to a corresponding read line of the n read lines, a second electrode receiving a first supply voltage, and a control electrode receiving a second clock.

(10) In the feature (9), each of the second transistors inputs the first supply voltage to each of the read lines when turning on according to the second clock, and puts each of the read lines into a floating state in an off period until subsequently receiving the second clock.

(11) In the feature (10), the first clock turns on after the second clock, and the first transistor in each of the photosensor pixels connects the lower electrode and each of the read lines when turning on according to the first clock.

(12) A photosensor array includes: (m×n) photosensor pixels and (m×1) compensation photosensor pixels arranged in an array; n read lines, and a compensation pixel read line. Each of the photosensor pixels includes a lower electrode formed of a metal film; an amorphous silicon film disposed on the lower electrode; an n-type amorphous silicon film disposed on the amorphous silicon film; an upper electrode that is disposed on the n-type amorphous silicon film, and receives a first reference voltage; and a first transistor having a second electrode connected to a corresponding read line of the n read lines, a first electrode connected to the lower electrode, and a control electrode receiving a first clock. Each of the compensation photosensor pixels includes a lower electrode formed of a metal film; an amorphous silicon film that is disposed on the lower electrode and blocked from light; an n-type amorphous silicon film disposed on the amorphous silicon film; an upper electrode that is disposed on the n-type amorphous silicon film, and receiving a first reference voltage; and a second transistor having a second electrode connected to the compensation pixel read line, a first electrode connected to the lower electrode, and a control electrode receiving a first clock. Each of the photosensor pixels outputs a voltage corresponding to the amount of light input to the amorphous silicon film as a sensor output voltage.

(13) In the feature (12), each of the photosensor pixels and the compensation photosensor pixels has a capacitive element that is connected between the lower electrode and the second reference voltage.

(14) In the feature (12) or (13), there are further provided n third transistors each having a first electrode connected to a corresponding read line of the n read lines, a second electrode receiving a first supply voltage, and a control electrode receiving a second clock; and a fourth transistor having a first electrode connected to the compensation pixel read line, a second electrode receiving a first supply voltage, and a control electrode receiving a second clock.

(15) In the feature (14), each of the third transistors inputs the first supply voltage to each of the read lines when turning on according to the second clock, and puts each of the read lines into a floating state in an off period until subsequently receiving the second clock, and the fourth transistor inputs the first supply voltage to the compensation pixel read lines when turning on according to the second clock, and puts the compensation pixel read lines into the floating state in the off period until subsequently receiving the second clock.

(16) In the feature (15), the first clock turns on after the second clock, the first transistor in each of the photosensor pixels connects the lower electrode and a corresponding read line of the n read lines when turning on according to the first clock, and the second transistor in each of the compensation photosensor pixels connects the lower electrode and the compensation pixel read line when turning on according to the first clock.

(17) In any one of the features (7) to (16), there are further provided a first reference voltage line that applies the first reference voltage, a second reference voltage line that applies the second reference voltage, a first supply voltage line that applies the first supply voltage, m scanning lines that supply the first clock, and a second clock line that supplies the second clock.

(18) In the feature (17), there is further provided a scanning circuit that is connected to the m scanning lines, and sequentially supplies the first clock to the respective scanning lines every one horizontal scanning period.

(19) In any one of the features (9), (10), (11), (14), (15), and (16), the first supply voltage is higher than the first reference voltage.

(20) In the feature (8) or (13), the first reference voltage and the second reference voltage have the same voltage.

(21) In anyone of the features (8) to (16), there is further provided a signal processing circuit that receives the sensor output voltages of the respective photosensor pixels, and compensation signal voltage of the compensation photosensor pixel, and the signal processing circuit includes an A/D converter that subjects the respective sensor output voltages and the compensation signal voltage to A/D conversion, and a subtractor that subtracts a digital value of the compensation signal voltage converted by the A/D converter from digital values of the respective sensor output voltages converted by the A/D converter.

The advantages obtained by the typical configuration of the invention disclosed in the present application will be described in brief as follows.

According to the present invention, in the photosensor and the photosensor array using the thick amorphous silicon film as a variable resistance element depending on light, the photocurrent by photoconduction can be amplified and output by the diode formed by the junction plane between the thick amorphous silicon film and the low-resistant n-type amorphous silicon film which is inserted between an upper electrode and the thick amorphous film.

DETAILED DESCRIPTION OF THE INVENTION

Hereinafter, an embodiment of the present invention will be described in detail with reference to the accompanying drawings.

Note that parts having the same functions in all drawings for illustrating the embodiments will be denoted by identical reference characters, and their repetitive description will be omitted. Also, the following embodiments do not limit the interpretation of claims of the present invention.

Photosensor According to this Embodiment

In this embodiment, a photosensor element uses an amorphous silicon film (a-Si) and an n-type amorphous silicon film (n+a-Si) doped with phosphorus.

Figure 1:
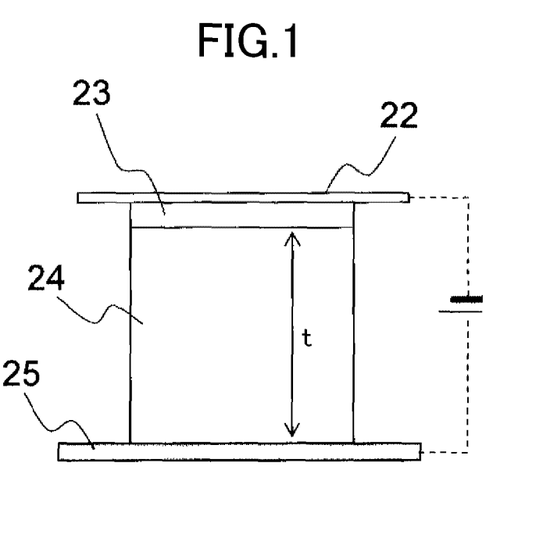
FIG. 1 is a cross-sectional view illustrating a cross-section structure of a photosensor according to an embodiment of the present invention.

FIG. 1 is a cross-sectional view illustrating a cross-section structure of a photosensor for one pixel used in a photosensor array according to an embodiment of the present invention.

As illustrated in FIG. 1, a photosensor according to the present invention includes a lower electrode 25, an amorphous silicon film (a-Si) 24 that is stacked on the lower electrode 25, an n-type amorphous silicon film (n+a-Si) 23 that is stacked on the amorphous silicon film (a-Si) 24 and doped with phosphorus, and an upper electrode 22 that is disposed on the n-type amorphous silicon film (n+a-Si) 23. That is, in this embodiment, the n-type amorphous silicon film (n+a-Si) 23 and the amorphous silicon film (a-Si) 24 are held between the upper electrode 22 and the lower electrode 25.

It is preferable that the material of the upper electrode 22 and the lower electrode 25 is so selected as to make an ohmic connection with the amorphous silicon film (a-Si) 24 and the n-type amorphous silicon film (n+a-Si) 23, respectively, or make an ohmic connection in a forward bias direction that will be described later. Also, because this configuration is used as the photosensor, there is a need to select the electrode on a light incident side which transmits a light of a desired wavelength. As one example, the upper electrode 22 is made of ITO (indium tin oxide), and the lower electrode 25 is made of MoW/Al—Si/MoW.

Figure 2:
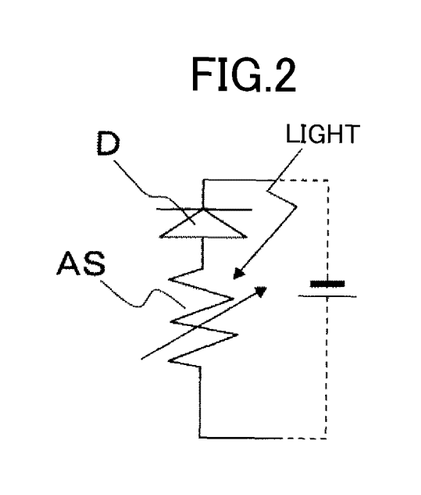
FIG. 2 is a circuit diagram illustrating an equivalent circuit of the photosensor illustrated in FIG. 1.

FIG. 2 is a circuit diagram illustrating an equivalent circuit of the photosensor illustrated in FIG. 1.

As indicated by a diode D of FIG. 2, the n-type amorphous silicon film (n+a-Si) 23 is an n-type semiconductor higher in impurity concentration than the amorphous silicon film (a-Si) 24. Therefore, a junction plane between the n-type amorphous silicon film (n+a-Si) 23 and the amorphous silicon film (a-Si) 24 exhibits a diode characteristic having an anode at the amorphous silicon film (a-Si) 24 side and a cathode at the n-type amorphous silicon film (n+a-Si) 23 side.

Also, when a light is input to the amorphous silicon film (a-Si), electrons are excited to produce electron-hole pairs, and conduction carriers increase to increase a current. That is, as indicated by AS in FIG. 2, the amorphous silicon film (a-Si) functions as a light-dependent variable resistance element changed according to light. This is a phenomenon called "photoconduction".

In order to put the photosensor using this photoconduction into practical use, a thickness t of the amorphous silicon film (a-Si) 24 is an important factor.

Figure 3:
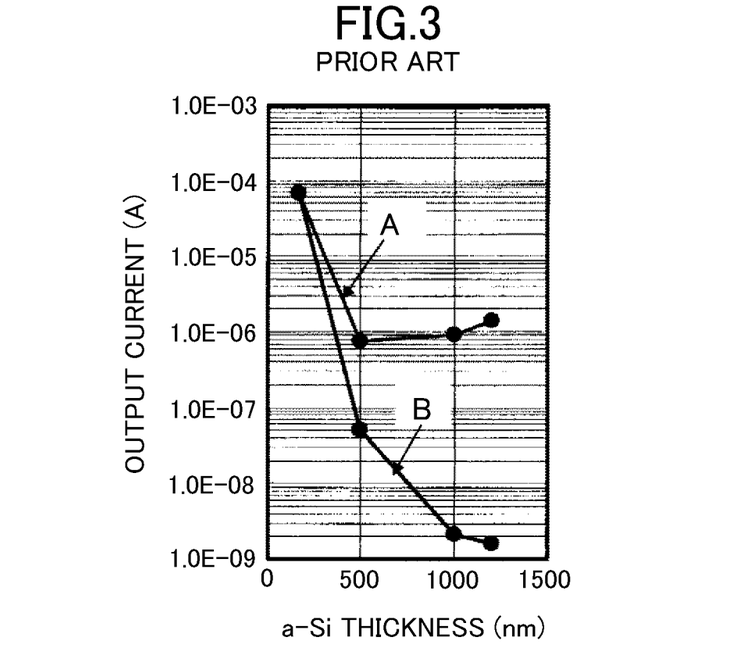
FIG. 3 is a graph illustrating an example of a relationship between a thickness and photoconduction of an amorphous silicon film.

FIG. 3 is a graph illustrating one example of a relationship between the thickness t and the photoconduction of the amorphous silicon film (a-Si). Referring to FIG. 3, symbol A represents a relationship between the thickness t and the photoconduction of the amorphous silicon film (a-Si) when the amorphous silicon film (a-Si) is irradiated with light, and B represents a relationship between the thickness t and the photoconduction of the amorphous silicon film (a-Si) when the amorphous silicon film (a-Si) is not irradiated with light.

As illustrated in FIG. 3, when the thickness of the amorphous silicon film (a-Si) is thin such as 170 nm, the resistance of the amorphous silicon film (a-Si) is low, and a current (bias current or dark current) that flows in a state where the amorphous silicon film (a-Si) is not irradiated with light, that is, in a dark state is large. Therefore, a current increase attributable to a change in resistance caused by the photoconduction at the time of light irradiation is buried in the bias current, and cannot be observed (separated).

On the other hand, when the thickness of the amorphous silicon film (a-Si) is thickened to 500 nm, 1000 nm, and 1200 nm, a resistance in the thickness direction (distance between those electrodes) becomes larger, and the bias current is decreased. For that reason, as illustrated in FIG. 3, a difference occurs between the current increase attributable to the change in resistance caused by the photoconduction at the time of light irradiation, and the bias current. This difference depends on the amount of light. This structure can be used as the photosensor by measurement of this difference.

Figure 4:
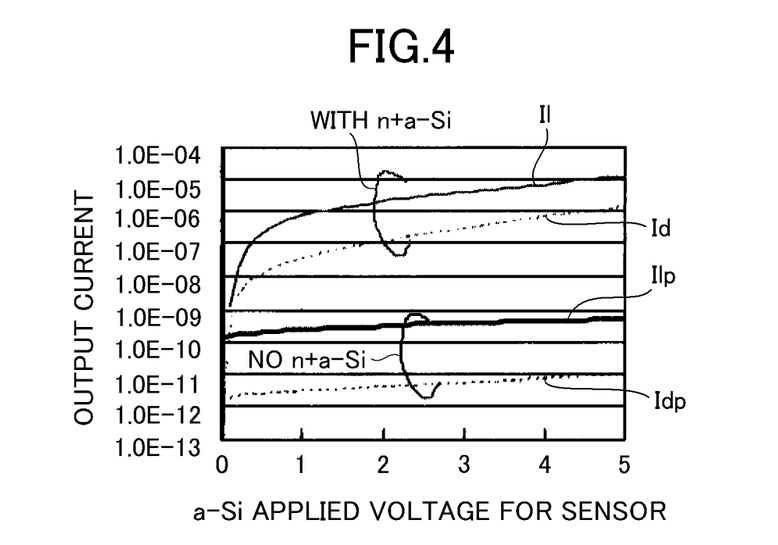
FIG. 4 is a graph illustrating currents in a structure of only an amorphous silicon film (a-Si) and a structure in which an n-type amorphous silicon film (n+a-Si) is stacked on the amorphous silicon film (a-Si) according to the present invention in case of dark and irradiation with the same amount of light for comparison.

FIG. 4 is a graph illustrating currents in the photosensor (having no "n+a-Si" in FIG. 4) using photoconduction which is configured by only an amorphous silicon film (a-Si), and in a test sample of the photosensor (having the "n+a-Si" in FIG. 4) in which the n-type amorphous silicon film (n+a-Si) is stacked on the amorphous silicon film (a-Si) in case of dark and irradiation with the same amount of light for comparison. As is apparent from FIG. 4, as in this embodiment, a current I1 of a light irradiation signal and a dark current Id flowing in the photosensor in which the n-type amorphous silicon film (n+a-Si) is stacked on the amorphous silicon film (a-Si) is about 10000 times as large as a current I1$p$ of a light irradiation signal and a dark current Idp flowing in the photosensor including only the amorphous silicon film (a-Si) respectively. Thus, the photosensor according to this embodiment has the current amplification effect of 10000 times as large as that of the prior art.

Figure 5:
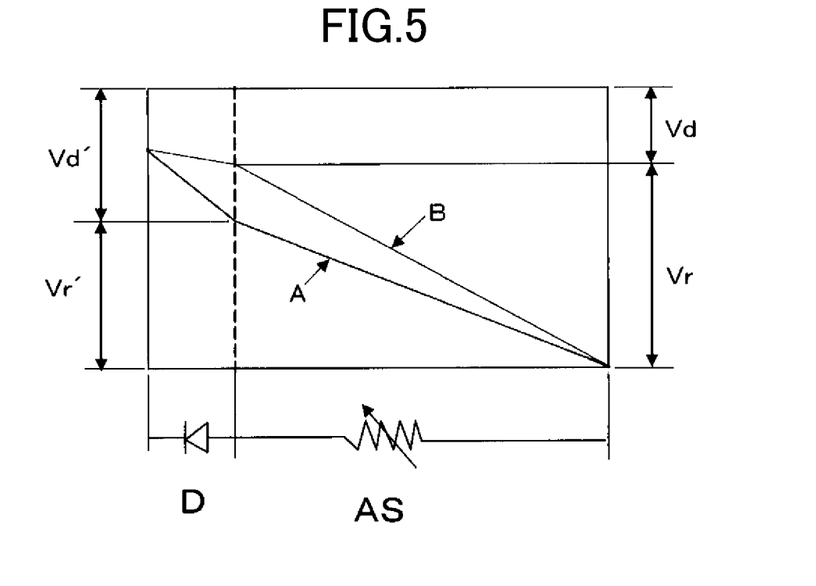
FIG. 5 is a diagram illustrating the operation of the photosensor according to the embodiment of the present invention.

The reasons will be described below. FIG. 5 is a diagram illustrating voltages applied to a diode D and a light-dependent variable resistance part AS of the photosensor. It is assumed that the voltages applied to the diode D and the light-dependent variable resistance element AS of the amorphous silicon film (a-Si) are Vd and Vr, respectively in a state that a dark bias current flows in the photosensor. In this example, it is assumed that Vd+Vr are constant (VD). In this state, when the amorphous silicon film (a-Si) is irradiated with light, a resistance value of the light-dependent variable resistance element AS of the amorphous silicon film (a-Si) becomes low due to the photoconduction, Vr is decreased, and Vd is increased, thereby increasing the forward voltage applied to the diode.

Figure 6:
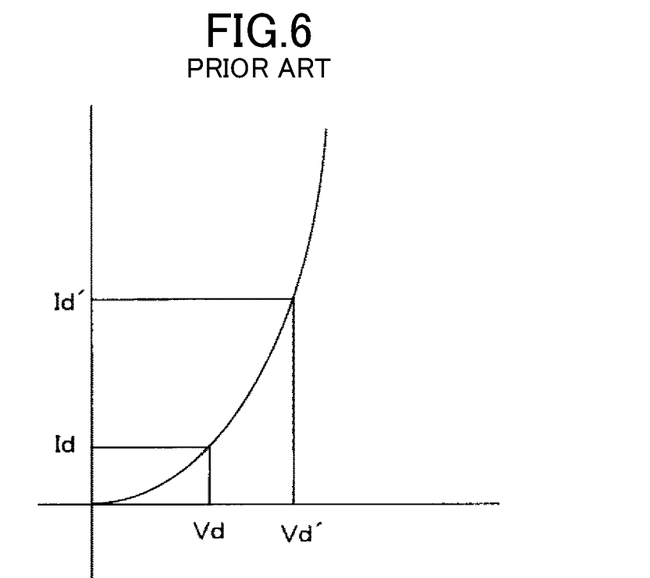
FIG. 6 is a graph illustrating current-voltage characteristics of a general diode.

FIG. 6 illustrates current-voltage characteristics of a general diode. According to the voltage-current characteristics of the diode, increase in the forward voltage precipitously increases a current as illustrated in FIG. 6. The current increase is equivalent to that conduction carriers are implanted into the light-dependent variable resistance element AS of the amorphous silicon film (a-Si). Therefore, the effective resistance of the light-dependent variable resistance element AS of the amorphous silicon film (a-Si) is further decreased.

Finally, a current flows, which balances the diffused carriers in the diode due to an increased Vd' of the forward voltage applied to the diode D, the resistance value of the light-dependent variable resistance element AS of the amorphous silicon film (a-Si) that has been low in resistance, and a divided voltage Vr' determined according to a flowing current.

In this way, the n-type amorphous silicon film (n+a-Si) is stacked on the amorphous silicon film (a-Si), thereby being capable of obtaining a photocurrent amplified by the diode configured by the n-type amorphous silicon film (n+a-Si) and the amorphous silicon film (a-Si).

One Example of Photosensor Array

Figure 7:
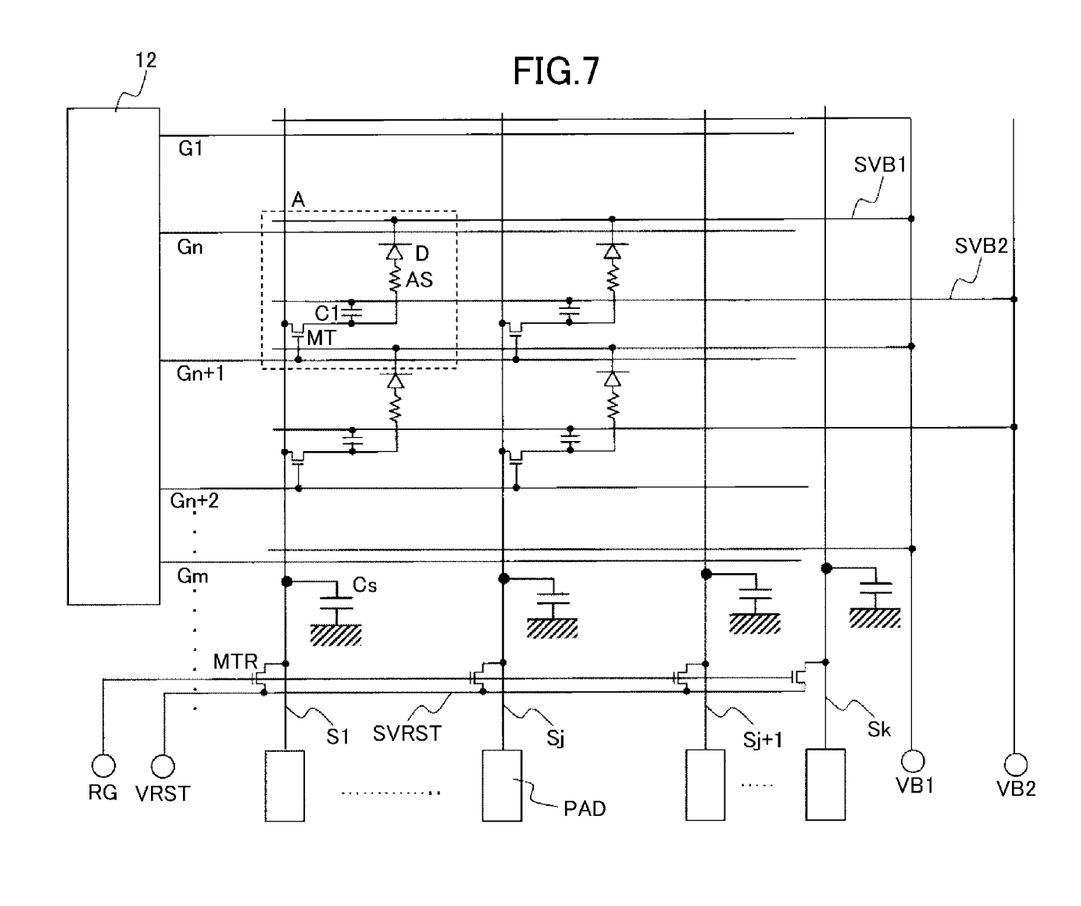
FIG. 7 is a circuit diagram illustrating one example of a circuit configuration of a photosensor array according to the embodiment of the present invention.

FIG. 7 is a circuit diagram illustrating one example of a circuit configuration of the photosensor array according to this embodiment. A part surrounded by a dotted frame in FIG. 7 represents a photosensor pixel A. FIG. 7 illustrates only the photosensor pixels for four pixels, but in fact, for example, (100×150) photosensor pixels are arranged.

Each of the photosensor pixels are structured such that the n-type amorphous silicon film (n+a-Si) 23 and the amorphous silicon film (a-Si) 24 are held between the upper electrode 22 and the lower electrode 25. In FIG. 7 each of the photosensor pixels is represented by an equivalent circuit illustrated in FIG. 2.

One of the photosensor pixel includes a thin-film transistor MT, the diode D, the light-dependent variable resistance element AS, and a capacitive element C1.

One terminal of the light-dependent variable resistance elements AS of the photosensor pixels on each column of the photosensors arranged in a matrix is connected to corresponding one of plural read lines S1, S2, . . . through the thin-film transistor MT. The voltage changes of the respective read lines S1, S2, . . . in one horizontal scanning period are output to an external signal processing circuit (not shown) from bonding pads PAD as signal voltages.

A gate of each thin-film transistor MT is connected to a corresponding scanning line of plural scanning lines G1, G2, . . . , and each of the scanning lines G1, G2, . . . is connected to a shift register 12. The shift register 12 sequentially applies a selection scanning voltage (second clock) of high level (hereinafter referred to as "H level") to the scanning lines G1, G2, . . . every one horizontal scanning period.

The shift register 12 is configured by a circuit mounted in a semiconductor chip, and arranged on a substrate where the photosensor array is fabricated. Alternatively, the shift register 12 is configured by a circuit including a thin-film transistor in which a semiconductor layer is formed of a polysilicon layer on a photosensor array substrate such as a glass substrate. Plural reset transistors MTR are each disposed between each of the read lines S1, S2, . . . and a wiring that applies a reset voltage VRST, and controlled by a signal RG. Also, a floating capacitance Cs occurs between each of the read lines S1, S2, . . . , and an external wiring.

A cathode of the diode D in the photosensor pixel is connected to a bias line SVB1 to which a bias voltage VB1 is applied. Also, the other terminal of the capacitive element C1 having one terminal connected to the light-dependent variable resistance element AS is connected to a bias line SVB2 to which a bias voltage VB2 is applied.

The reset voltage VRST is applied to each of the read lines S1, S2, . . . through a reset line SVRST when each of the reset transistors MTR is on.

Figure 8:
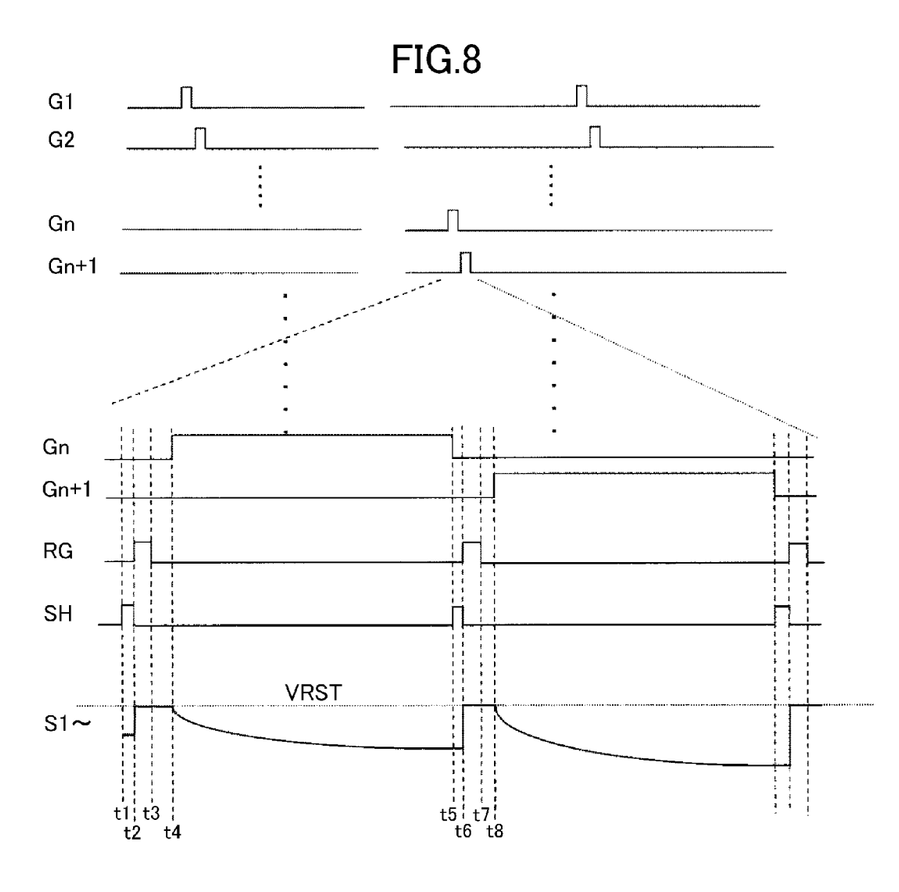
FIG. 8 is a timing chart illustrating a method of driving the photosensor array illustrated in FIG. 7.

FIG. 8 is a timing chart illustrating a method of driving the photosensor array illustrated in FIG. 7. Hereinafter, a description will be given of the method of driving the photosensor array illustrated in FIG. 7 with reference to FIG. 8. Referring to FIG. 7, the respective rows of the photosensor pixels are sequentially scanned downward by the shift register 12. That is, referring to FIG. 7, a voltage of H level is sequentially applied to the scanning lines G in an increasing order of number.

Also, for facilitation of description, VB1=0 V and VRST=5 V are assumed. The bias voltage VB2 is set 0 V although being not particularly limited, and arbitrary. In the output of the shift register 12, that is, the pulse on the scanning line, H level is a voltage for turning on the thin-film transistor MT, and a Low level (hereinafter referred to as "L level") is a voltage for turning off the thin-film transistor MT. In this example, the voltages of H level and L level are 10 V and 0 V, respectively. Further, the voltage values of the respective bias voltages are exemplary, and the respective bias voltages may be other than the above-mentioned values.

First, at a time t2 in a blanking period of one horizontal scanning period HSYNC, the signal RG (second clock) becomes H level, and the reset transistor MTR turns on. With this operation, the reset voltage VRST is applied to the respective read lines S1, S2, . . . through the reset line SVRST. As a result, the potentials (potentials held by the floating capacitance Cs of the read lines) of the respective read lines S1, S2, . . . are uniformly set to a fixed potential (for example, 5 V).

Then, at a time t3, the signal RG becomes L level, and at a time t4, the first clock supplied to the scanning line Gn becomes H level. With this operation, the thin-film transistor MT having a gate connected to the scanning line Gn turns on. As a result, the diode D of the photosensor pixel having the thin-film transistor MT having a gate connected to the scanning line Gn, the light-dependent variable resistance element AS, and the capacitive element C1 are connected to the respective read lines S1, S2, . . . .

At this time, the voltages of the respective read lines S1, S2, . . . are decreased by the voltage fluctuation due to the capacity distribution of electric charge accumulated in the capacitive element C1, and by a discharge current flowing to the bias line SVB1 through the light-dependent variable resistance element AS and the diode D during the connection time.

For example, in the photosensor pixel that is not irradiated with light, a dark current flows due to the resistance value of the light-dependent variable resistance element AS whereby the potential of the read line (for example, read line S1) is decreased to, for example, 4.5 V. On the other hand, the resistance value of the light-dependent variable resistance element AS of the photosensor pixel that is irradiated with light causes a current to be amplified by photoconduction whereby the potential of the read line (for example, read line S2) is decreased to, for example, 2.5 V. The waveform of the read line S1—in FIG. 8 shows the voltage change.

In this way, in this embodiment, in timing when the signal RG becomes H level, after the potentials of the respective read lines S1, S2, . . . are uniformly set to the fixed potential (for example, 5 V), the potentials of the respective read lines S1, S2, . . . are allowed to fluctuate (drop in FIG. 8) due to an incident light.

In the blanking period of one horizontal scanning period HSYNC, before the RG signal becomes H level, the external signal processing circuit connected to the bonding pad (PAD1) takes in this signal voltage.

Figure 9:
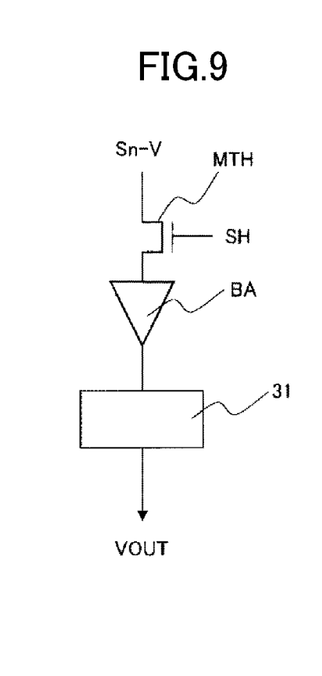
FIG. 9 is a block diagram illustrating an example of an external signal processing circuit in the photosensor array illustrated in FIG. 7.

FIG. 9 is a block diagram illustrating an example of an external signal processing circuit.

In the signal processing circuit illustrated in FIG. 9, a signal voltage (Sn-V) of the photosensor pixels on a certain row read from the respective read lines S1, S2, . . . is taken by a switch transistor MTH, input to an A/D converter 31 through a buffer circuit BA, and converted into a digital signal.

As illustrated in FIG. 8, in this example, the switch transistor MTH turns on due to a sample and hold voltage SH that is H level before the RG signal becomes H level in the blanking period of one horizontal scanning period HSYNC, and takes in the signal voltage (Sn-V) of the photosensor pixels on the certain row read from the respective read lines S1, S2, . . . in the photosensor array.

Subsequently, the signal voltage is taken in the same manner as that described above. The same processing is applied to the scanning lines other than the scanning line Gn to take in the signal voltage.

Other Examples of Photosensor Array

In the above-mentioned photosensor array illustrated in FIG. 7, a relatively large dark current component is always included in the output signal voltage (or current). Also, because the dark current of amorphous silicon that is a high-resistant semiconductor depends on temperature, there is a need to compensate the dark current component under the usage environment. The photosensor array described below is configured to compensate the dark current component.

Figure 10:
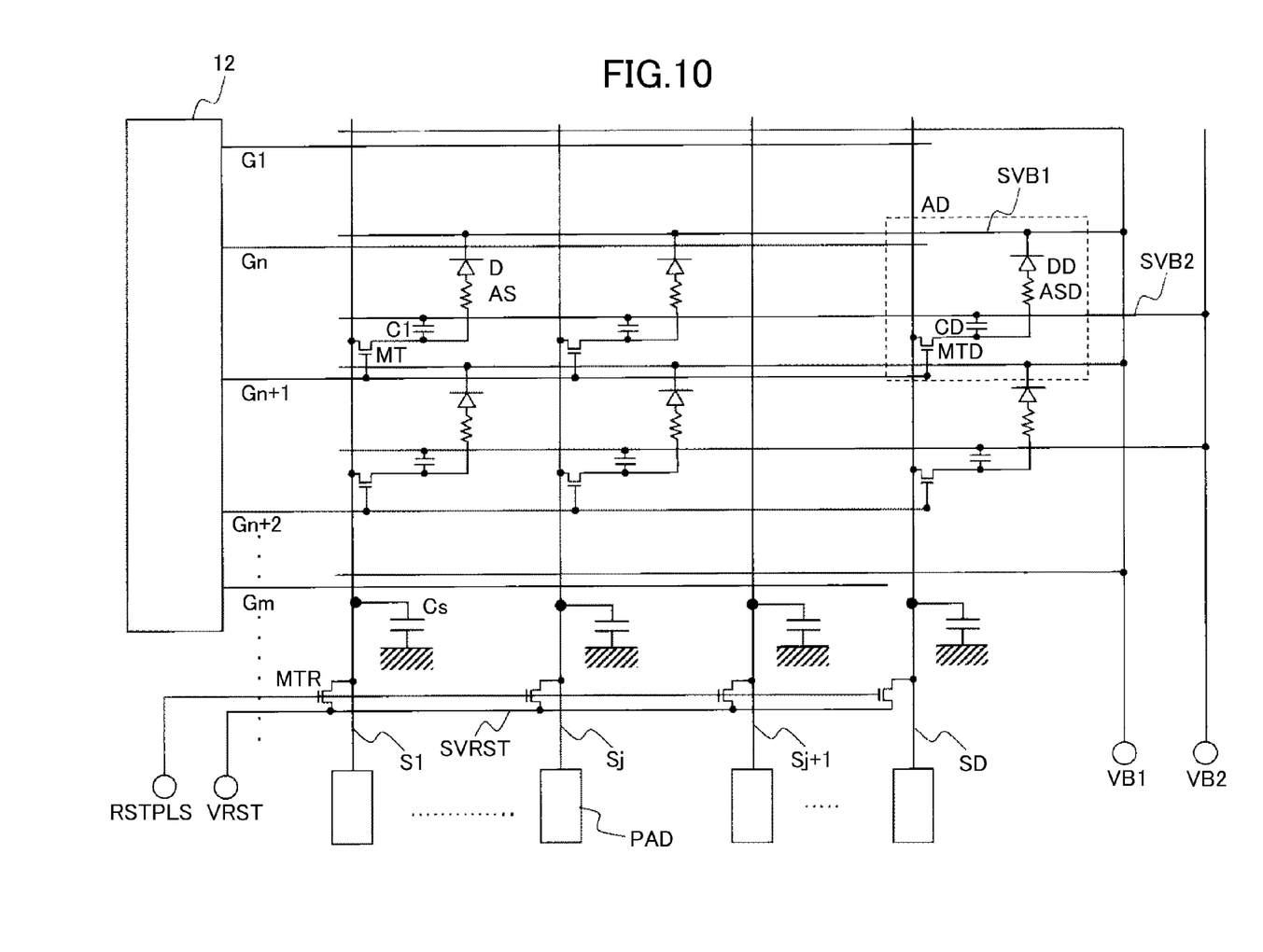
FIG. 10 is a circuit diagram illustrating another example of the circuit configuration of the photosensor array according to the embodiment of the present invention.

FIG. 10 is a circuit diagram illustrating another example of the circuit configuration of the photosensor array according to this embodiment.

A difference between the photosensor array illustrated in FIG. 10 and the photosensor array illustrated in FIG. 7 mainly resides in that a dark current compensation photosensor pixel AD is disposed on each row of the photosensor array. In FIG. 10, one dark current compensation photosensor pixel AD is arranged on each row of the photosensor array. With this configuration, the dark current compensation photosensor pixels AD on one column are disposed on an opposite end of the shift register 12 of the photosensor array.

In this example, the dark current compensation photosensor pixel AD for one pixel includes a thin-film transistor MTD, a diode DD, a light-dependent variable resistance element ASD, and a capacitive element CD.

The structure of the dark current compensation photosensor pixel AD is identical with the structure illustrated in FIG. 1. A light shielding film to prevent the dark current compensation photosensor pixel AD from an incident light is on the photosensor pixel AD. The method of driving the photosensor array according to this embodiment is also identical with that in FIG. 8. However, the signal voltage of the dark current compensation photosensor pixel AD is output from a dark current compensation read line SD.

In the photosensor array illustrated in FIG. 10, a dark state is produced under the usage environment, and a process of subtracting the voltage from the output during the light irradiation is executed by the external signal processing circuit to compensate the dark current component.

Figure 11:
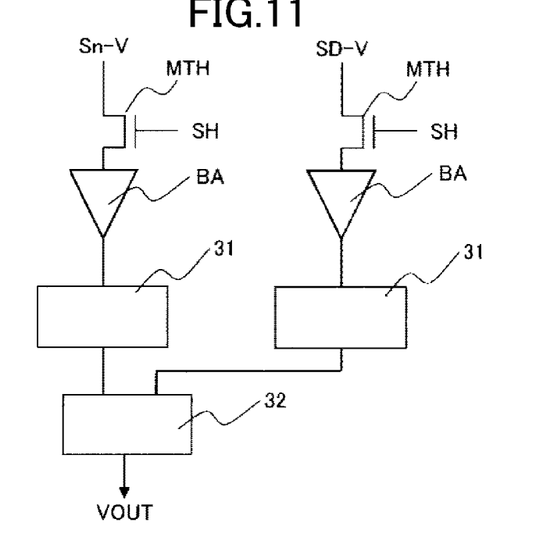
FIG. 11 is a block diagram illustrating an example of an external signal processing circuit that compensates a dark current component in the photosensor array illustrated in FIG. 10.

FIG. 11 is a block diagram illustrating an example of the external signal processing circuit that compensates the dark current component.

In the signal processing circuit illustrated in FIG. 11, the signal voltage (Sn-V) of the photosensor pixels on the certain row read from the respective read lines S1, S2, . . . in the photosensor array, and a signal voltage (SD-V) of a dark current compensation photosensor pixel PXD read from the dark current compensation real line SD are taken by the switch transistor MTH, input to the A/D converter 31 through the buffer circuit BA, and converted into the digital signal. Thereafter, a subtractor 32 subtracts the digital signal voltage of the dark current compensation photosensor pixel PXD from the digital signal voltage of the photosensor pixel for each row, so as to compensate the dark current component.

The switch transistor MTH turns on due to H level of the sample and hold voltage SH before the RG signal becomes H level in the blanking period of one horizontal scanning period HSYNC, and takes in the signal voltage (Sn-V) of the photosensor pixels on the certain row read from the respective read lines S1, S2, . . . in the photosensor array.

In the above respective embodiments, there is no need to externally provide the signal processing circuit, and as with the shift register 12 illustrated in FIG. 6, the signal processing circuit may be mounted within the semiconductor chip, and disposed on a substrate where the photosensor array is fabricated. Alternatively, the signal processing circuit may be configured by a circuit including a thin-film transistor in which a semiconductor layer is formed of a polysilicon layer on a photosensor array substrate such as a glass substrate.

Also, in the above-mentioned embodiment, a current amplifying ratio in which the diode D in the photosensor pixel amplifies the signal current is about 10,000. As occasion demands, there may be a difficulty to form the capacitive element C1 that can accumulate the signal current from the viewpoint of layout. In this case, the capacitive elements other than the capacitive element (floating capacity or parasitic capacity) attributable to the parasitic effect may be deleted, and only a current within the read time may be directly measured as the signal current.

Also, the reset transistors MTR can be arranged within the external circuit connected to the external of the photosensor array so that the reset transistors MTR illustrated in FIGS. 7 and 10 can be removed.

Further, in the above-mentioned embodiment, the voltage output system has been described in which the potential of the respective read lines S1, S2, . . . (in more detail, the potential held by the floating capacitance Cs of the read line) is reset by the voltage VRST, and after the respective read lines S1, S2, . . . have been connected to the respective photosensor pixels, the potential changes of the respective read lines S1, S2, . . . , which are caused by discharge of electric charge stored in the respective read lines S1, S2, . . . are output. Alternatively, there can be applied a current output system in which the reset transistors MTR can be eliminated, and the current is directly measured within the external circuit.

Figure 12:
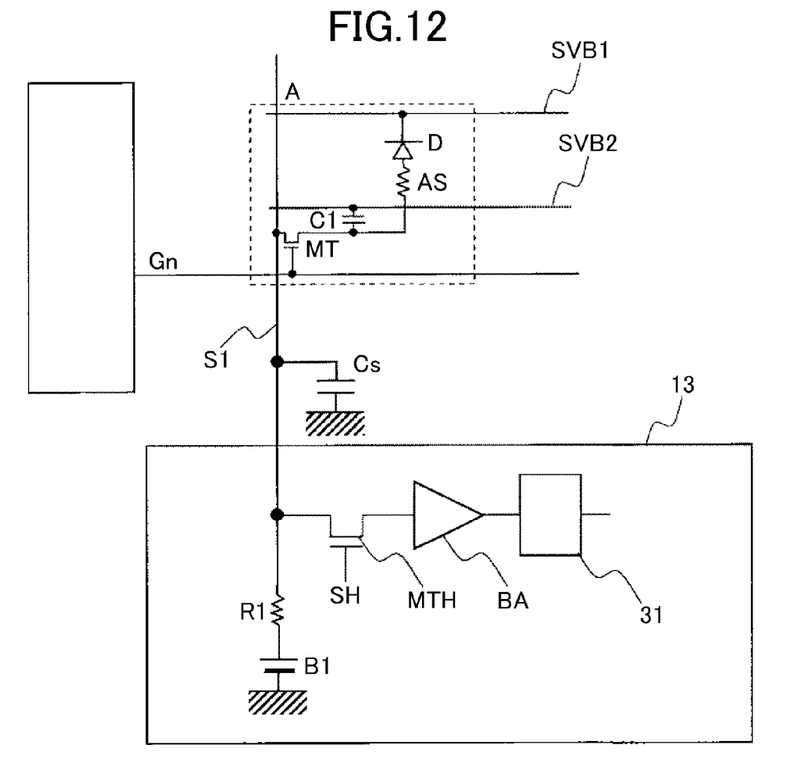
FIG. 12 is a diagram illustrating a current output system that directly measures a current within an external circuit.

FIG. 12 is a diagram illustrating a current output system that directly measures the current within the external circuit. In FIG. 12, only the read line S1 and one photosensor pixel A are illustrated.

Referring to FIG. 12, an external circuit 13 is configured by an Integrated Circuit (IC) etc. In a configuration illustrated in FIG. 12, each of the read lines S1, S2, . . . is connected to a power supply B1 through a resistance element R1. With this configuration, a current flows in the bias line SVB1 through the light-dependent variable resistance element AS and the diode D in the photosensor pixel having the thin-film transistor MT that turns on.

This current fluctuates according to the light with which the photosensor pixel is irradiated, and therefore a voltage between both ends of the resistance element R1 fluctuates. Under the circumstances, a voltage at a terminal of the resistance element R1 which is connected to each of the read lines S1, S2, . . . is taken by the switch transistor MTH, input to the A/D converter 31 through the buffer circuit BA, and converted into a digital signal.

In this situation, before the RG signal becomes H level in the blanking period of one horizontal scanning period HSYNC, the switch transistor MTH turns on due to the sample and hold voltage SH that becomes H level so as to take in the voltage at a terminal of the resistance element R1 which is connected to each of the read lines S1, S2, . . . .

While there have been described what are at present considered to be certain embodiments of the invention, it will be understood that various modifications may be made thereto, and it is intended that the appended claims cover all such modifications as fall within the true spirit and scope of the invention.

What is claimed is:
1. A photosensor, comprising:
a lower electrode formed of a metal film;
an amorphous silicon film disposed on the lower electrode;
an n-type amorphous silicon film disposed on the amorphous silicon film;
an upper electrode that is disposed on the n-type amorphous silicon film, and receives a first reference voltage;
a switch circuit that inputs a first supply voltage to the lower electrode in an on-state, and puts the lower electrode into a floating state in an off-state;
a detector circuit that detects a voltage change in the lower electrode after irradiating the amorphous silicon film for a given period with light when the switch circuit is on; and
a capacitive element connected between the lower electrode and a second reference voltage.

2. The photosensor according to claim 1, wherein the first reference voltage and the second reference voltage have the same voltage.

3. A photosensor, comprising:
a lower electrode formed of a metal film;
an amorphous silicon film disposed on the lower electrode;
an n-type amorphous silicon film disposed on the amorphous silicon film;
an upper electrode that is disposed on the n-type amorphous silicon film, and receives a first reference voltage;
a switch circuit that inputs a first supply voltage to the lower electrode in an on-state, and puts the lower electrode into a floating state in an off-state; and
a detector circuit that detects a voltage change in the lower electrode after irradiating the amorphous silicon film for a given period with light when the switch circuit is on;
wherein a thickness of the amorphous silicon film is 500 nm or higher.

4. The photosensor according to claim 3, wherein a thickness of the amorphous silicon film is 1200 nm or lower.

5. A photosensor array, comprising:
(m×n) photosensor pixels arranged in an array; and
n read lines,
wherein each of the photosensor pixels includes:
a lower electrode formed of a metal film;
an amorphous silicon film disposed on the lower electrode;
an n-type amorphous silicon film disposed on the amorphous silicon film;
an upper electrode that is disposed on the n-type amorphous silicon film, and receives first reference voltage; and
a first transistor having a second electrode connected to a corresponding read line of the n read lines, a first electrode connected to the lower electrode, and a control electrode receiving a first clock;
wherein each of the photosensor pixels whose first transistors is on outputs voltage change to one of the read lines within one horizontal scanning period as a sensor output voltage of the photosensor pixels; and
wherein each of the photosensor pixels includes a capacitive element connected between the lower electrode and a second reference voltage.

6. The photosensor array according to claim 5,
wherein the first reference voltage and the second reference voltage have the same voltage.

7. A photosensor array, comprising:
(m×n) photosensor pixels arranged in an array; and
n read lines,
wherein each of the photosensor pixels includes:
a lower electrode formed of a metal film;
an amorphous silicon film disposed on the lower electrode;
an n-type amorphous silicon film disposed on the amorphous silicon film;
an upper electrode that is disposed on the n-type amorphous silicon film, and receives a first reference voltage; and
a first transistor having a second electrode connected to a corresponding read line of the n read lines, a first electrode connected to the lower electrode, and a control electrode receiving a first clock;
wherein each of the photosensor pixels whose first transistor is on outputs a voltage change to one of the read lines within one horizontal scanning period as a sensor output voltage of the photosensor pixels; and
n second transistors each having a first electrode connected to a corresponding read line of the n read lines, a second electrode receiving a first supply voltage, and a control electrode receiving a second clock.

8. The photosensor array according to claim 7, wherein each of the second transistors inputs the first supply voltage to each of the read lines when turning on according to the second clock, and puts each of the read lines into a floating state in an off period until subsequently receiving the second clock.

9. The photosensor array according to claim 8, wherein the first clock turns on after the second clock, and the first transistor in each of the photosensor pixels connects the lower electrode and each of the read lines when turning on according to the first clock.

10. The photosensor array according to claim 7,
wherein the first supply voltage is higher than the first reference voltage.

11. A photosensor array, comprising:
(m×n) photosensor pixels and (m×1) compensation photosensor pixels arranged in an array;
n read lines, and
a compensation pixel read line,
wherein each of the photosensor pixels includes:
a lower electrode formed of a metal film;
an amorphous silicon film disposed on the lower electrode;
an n-type amorphous silicon film disposed on the amorphous silicon film;
an upper electrode that is disposed on the n-type amorphous silicon film, and receives a first reference voltage; and
a first transistor having a second electrode connected to a corresponding read line of the n read lines, a first electrode connected to the lower electrode, and a control electrode receiving a first clock,
wherein each of the compensation photosensor pixels includes:
a lower electrode formed of a metal film;
an amorphous silicon film disposed on the lower electrode;
the amorphous silicon film blocked from light;
an n-type amorphous silicon film disposed on the amorphous silicon film;
an upper electrode that is disposed on the n-type amorphous silicon film, and receiving a first reference voltage; and
a second transistor having a second electrode connected to the compensation pixel read line, a first electrode connected to the lower electrode, and a control electrode receiving a first clock, and
wherein each of the photosensor pixels outputs a voltage corresponding to the amount of light input to the amorphous silicon film as a sensor output voltage.

12. The photosensor array according to claim 11,
wherein each of the photosensor pixels and the compensation photosensor pixels has a capacitive element that is connected between the lower electrode and the second reference voltage.

13. The photosensor array according to claim 11, further comprising:
n third transistors each having a first electrode connected to a corresponding read line of the n read lines, a second electrode receiving a first supply voltage, and a control electrode receiving a second clock; and
a fourth transistor having a first electrode connected to the compensation pixel read line, a second electrode receiving the first supply voltage, and a control electrode receiving the second clock.

14. The photosensor array according to claim 13,
wherein each of the third transistors inputs the first supply voltage to each of the read lines when turning on according to the second clock, and puts each of the read lines into a floating state in an off period until subsequently receiving the second clock, and
wherein the fourth transistor inputs the first supply voltage to the compensation pixel read lines when turning on according to the second clock, and puts the compensation pixel read lines into the floating state in the off period until subsequently receiving the second clock.

15. The photosensor array according to claim 14,
wherein the first clock turns on after the second clock, the first transistor in each of the photosensor pixels connects the lower electrode and a corresponding read line of the n read lines when turning on according to the first clock, and the second transistor in each of the compensation photosensor pixels connects the lower electrode and the compensation pixel read line when turning on according to the first clock.

16. A photosensor array, comprising:
(m×n) photosensor pixels arranged in an array; and
n read lines,
wherein each of the photosensor pixels includes:
 a lower electrode formed of a metal film;
 an amorphous silicon film disposed on the lower electrode;
 an n-type amorphous silicon film disposed on the amorphous silicon film;
 an upper electrode that is disposed on the n-type amorphous silicon film, and receives a first reference voltage; and
 a first transistor having a second electrode connected to a corresponding read line of the n read lines, a first electrode connected to the lower electrode, and a control electrode receiving a first clock;
 wherein each of the photosensor pixels whose first transistor is on outputs a voltage change to one of the read lines within one horizontal scanning period as a sensor output voltage of the photosensor pixels; and
a first reference voltage line that applies the first reference voltage;
a second reference voltage line that applies the second reference voltage;
a first supply voltage line that applies the first supply voltage;
m scanning lines that supply the first clock; and
a second clock line that supplies the second clock.

17. The photosensor array according to claim 16, further comprising: a scanning circuit that is connected to the m scanning lines, and sequentially supplies the first clock to the respective scanning lines every one horizontal scanning period.

* * * * *